United States Patent
Cheng et al.

(10) Patent No.: US 9,349,606 B2
(45) Date of Patent: May 24, 2016

(54) METAL HARDMASK ALL IN ONE INTEGRATED ETCH

(75) Inventors: Yu Cheng, Fremont, CA (US); Junwen Huang, Shanghai (CN); Huiyuan Pei, Shanghai (CN); Jiangang Liu, Shanghai (CN); Youngjin Choi, San Ramon, CA (US); Liang Wang, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/398,101

(22) PCT Filed: May 2, 2012

(86) PCT No.: PCT/CN2012/074976
§ 371 (c)(1),
(2), (4) Date: Mar. 10, 2015

(87) PCT Pub. No.: WO2013/163796
PCT Pub. Date: Nov. 7, 2013

(65) Prior Publication Data
US 2015/0179472 A1    Jun. 25, 2015

(51) Int. Cl.
*H01L 21/311* (2006.01)
*H01L 21/768* (2006.01)

(52) U.S. Cl.
CPC .... *H01L 21/31144* (2013.01); *H01L 21/31116* (2013.01); *H01L 21/7684* (2013.01); *H01L21/76802* (2013.01); *H01L 21/76804* (2013.01); *H01L 21/76811* (2013.01); *H01L 21/76813* (2013.01); *H01L 21/76819* (2013.01); *H01L 21/76877* (2013.01)

(58) Field of Classification Search
CPC ................... H01L 21/31144; H01L 21/76877; H01L 21/76819; H01L 21/7684; H01L 21/76802; H01L 21/31116; H01L 21/76811; H01L 21/76804; H01L 21/76813; H01L 2924/00; H01L 2924/0002; H01L 21/76885; H01L 23/481; H01L 23/53238; H01L 21/76897; H01L 23/53295; H01L 21/32139; H01L 21/76831; H01L 2224/45147; H01L 23/5226; H01L 21/32136; H01L 21/76; H01L 23/485; H01L 23/5329; H01L 29/517; H01L 21/76834; H01L 2225/06541; H01L 21/28123; H01L 21/7685; H01L 21/76879; H01L 41/332; H01L 21/76805; H01L 21/76807
USPC ......................................... 438/675, 694, 703
See application file for complete search history.

(56) References Cited

U.S. PATENT DOCUMENTS

| | | | |
|---|---|---|---|
| 7,176,126 B2 | 2/2007 | Oh et al. | |
| 2006/0024948 A1* | 2/2006 | Oh | H01L 21/76807 438/622 |
| 2009/0131295 A1* | 5/2009 | Cui | H01L 21/02063 510/176 |
| 2009/0142931 A1 | 6/2009 | Wang | |
| 2009/0191711 A1 | 7/2009 | Rui et al. | |

FOREIGN PATENT DOCUMENTS

| | | |
|---|---|---|
| CN | 1146980 C | 4/2004 |
| CN | 1728358 | 2/2006 |
| CN | 101196691 | 6/2008 |
| CN | 101207072 | 6/2008 |

OTHER PUBLICATIONS

International Search Report dated Feb. 7, 2013 from International Application No. PCT/CN2012/074976.

* cited by examiner

*Primary Examiner* — Caleen Sullivan
(74) *Attorney, Agent, or Firm* — Beyer Law Group LLP

(57) ABSTRACT

A method for forming conductive contacts in a dielectric layer is provided. Partial vias are etched into the dielectric layer through a via mask. Trenches are etched into the dielectric layer through a trench mask, wherein the etching the trenches completes and over etches the vias to widen bottoms of the vias. Tops of the trenches or vias are rounded.

19 Claims, 3 Drawing Sheets

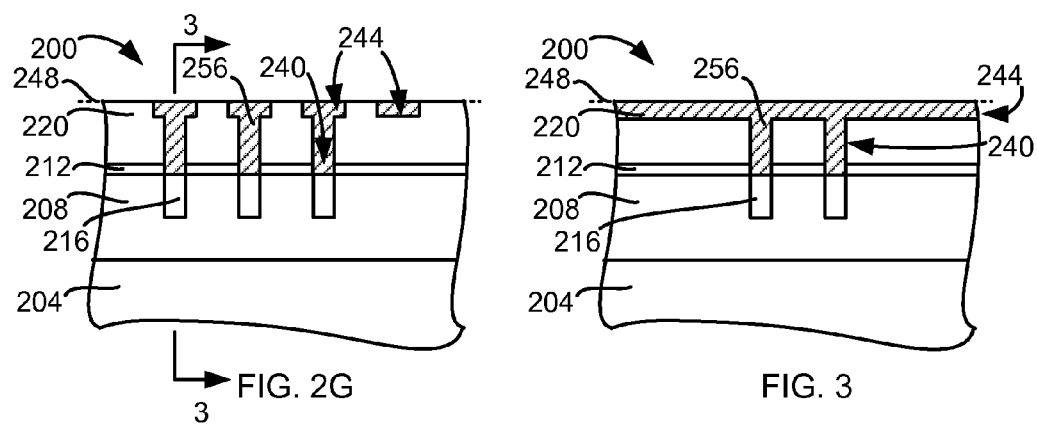

METAL HARDMASK ALL IN ONE INTEGRATED ETCH

BACKGROUND OF THE INVENTION

The present invention relates to the formation of vias and trenches in a dielectric layer. More specifically, the present invention relates to forming vias and trenches using a trench metal hardmask.

During semiconductor wafer processing, a dual damascene structure of vias and trenches are etched into a dielectric layer. The dual damascene structure is then filled with a conductive material to form contacts.

SUMMARY OF THE INVENTION

To achieve the foregoing and in accordance with the purpose of the present invention, a method for forming conductive contacts in a dielectric layer is provided. Partial vias are etched into the dielectric layer through a via mask. Trenches are etched into the dielectric layer through a trench mask, wherein the etching the trenches completes and over etches the vias to widen bottoms of the vias. Tops of the trenches or vias are rounded.

In another manifestation of the invention, a method for forming conductive contacts in a dielectric layer disposed below a trench mask disposed below a via mask forming a stack is provided. Partial vias are etched into the dielectric layer through the via mask. The trench mask is exposed. Trenches are etched into the dielectric layer through the trench mask, wherein the etching the trenches completes and over etches the vias to widen bottoms of the vias. Tops of the trenches or vias are rounded above a planarization line. The vias and trenches are filled with a conductive material. The stack is planarized to the planarization line.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 2A-G are schematic views of a stack processed according to an embodiment of the invention.

FIG. 3 is a cross-sectional view of the stack along cut line 3-3 of FIG. 2G.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
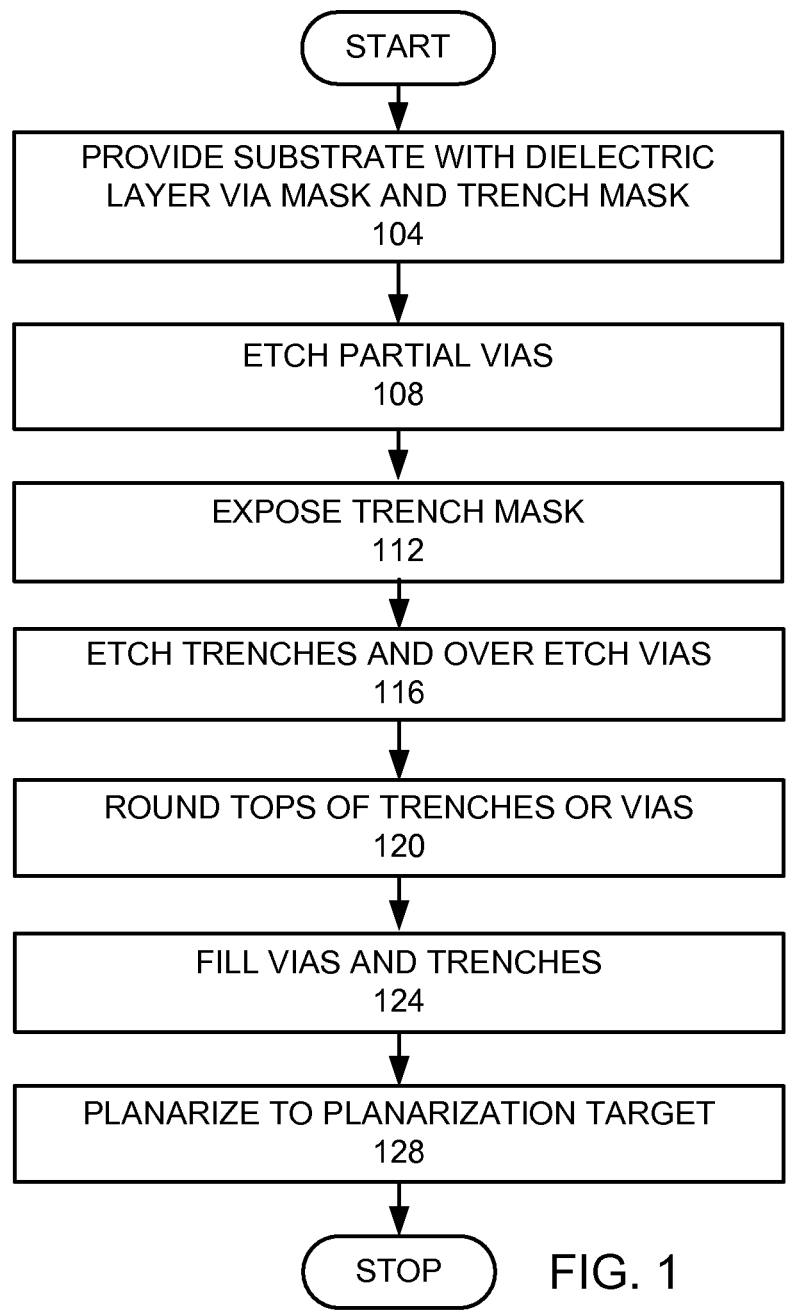
FIG. 1 is a high level flow chart of an embodiment of the invention.

To facilitate understanding, FIG. 1 is a high level flow chart of a process used in an embodiment of the invention. A substrate is provided with a dielectric layer over which a trench mask is placed, over which a via mask is placed (step 104). The trench mask may be a hard mask where a planarization layer separates the trench mask from the vias mask. Vias are partially etched into the dielectric layer through the via mask (step 108). The trench mask is exposed (step 112). Trenches are etched into the dielectric layer while the vias are completed and over etched (step 116). Over etching the vias may increase the width of the bottom of the vias. The tops of the trenches or vias are rounded, which in the specification and claims includes faceting or sloping the top corners (step 120). The vias and trenches are filled with a conductive material to form contacts (step 124). The dielectric layer is planarized to a planarization target (step 128).

Examples

Figure 2A:
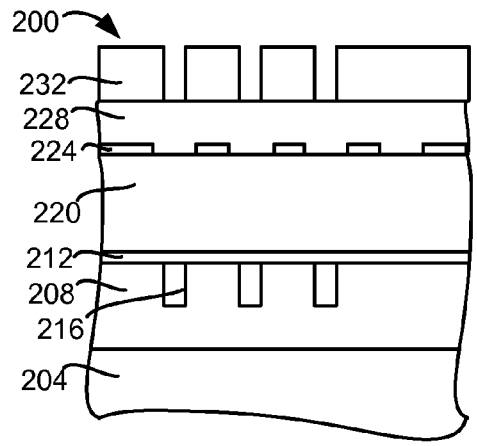

In an example of the invention, a substrate is provided with a dielectric layer over which a via mask is placed, over which a trench mask is placed (step 104). FIG. 2A is a cross-sectional view of a stack 200 with a substrate 204 over which a contact layer 208 has been formed. Over the contact layer 208 is an etch stop or barrier layer 212. Within the contact layer 208 are contacts 216. A dielectric layer 220 has been formed over the etch stop layer 212. In this embodiment, the etch stop layer 212 is a liner of nitrogen doped silicon carbide (SiCN). A patterned trench mask 224 has been formed over the dielectric layer 220. In this example, the patterned trench mask 224 is a hardmask. For example, the patterned trench mask 224 is titanium nitride (TiN). A planarization layer 228 is formed over the patterned trench mask 224. A patterned via mask 232 is formed over the planarization layer 228. The patterned via mask 232 may be of a photoresist or some other material. In other embodiments of the invention, additional layers may be added between the various layers and masks or various layers may be replaced with other layers or layers may be removed.

Figure 2B:
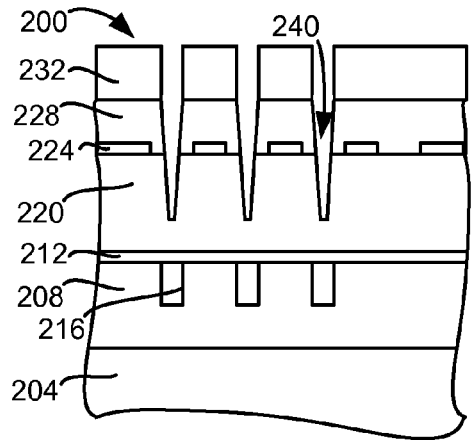

Vias are partially etched into the dielectric layer 220 through the vias mask 232. FIG. 2B is a cross sectional view of the stack 200 after vias 240 have been partially etched into the dielectric layer 220. In this example, the via sidewalls are slightly tapered. An example of a recipe that may be used to etch partial vias provides a via etch gas of $C_4F_8$, $CF_4$, $N_2$, Ar, and $O_2$. A chamber pressure is maintained between 20 to 60 mTorr. A wafer temperature is maintained between 50° to 100° C.

Figure 2C:
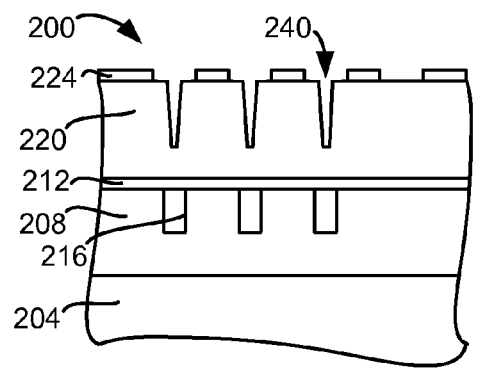

The trench mask 224 is then exposed (step 112). In one embodiment, the remaining vias mask 232 and the planarization layer 228 are removed simultaneously to expose the trench mask 224. In another embodiment, the via mask 232 may be removed during the etching of the partial via and the planarization layer 228 is removed during the exposure of the trench mask 224. FIG. 2C is a cross sectional view of the stack 200 after via mask 232 and planarization layer 228 have been removed to expose the trench mask 224. An example of a recipe that may be used to expose the trench mask provides a stripping gas of $CO_2$ and $O_2$. The chamber pressure is maintained between 20 to 60 mTorr. The wafer temperature is maintained between 50° to 100° C.

Figure 2D:
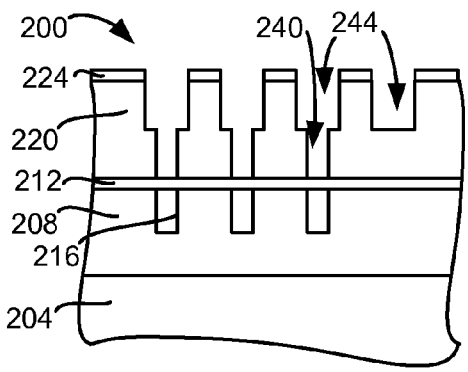

Trenches are etched into the dielectric layer through the patterned trench mask, which also completes and over etches the vias to widen bottoms of the vias (step 116). FIG. 2D shows the stack 200 after the trenches 244 are etched and the vias 240 are over etched, which widens the bottoms of the vias 240 forming less tapered and more vertical sidewalls. In this example, the vias have a circular cross-section, wherein the trenches have a linear cross-section along a line into the page, where each trench connects a plurality of vias. Preferably, the etch used for forming trenches and over etching the vias is more selective than the partial via etch. The advantage of the less selective partial via etch is that such an etch is faster. The advantage of the more selective trench etch and via over etch is that such an etch provides more vertical sidewalls with less taper. An example of a recipe that may be used to etch the trenches and over etch the vias provides a trench etch gas of $C_4F_8$, $CF_4$, $N_2$, Ar, and $O_2$. A chamber pressure 20 to 60 mTorr is provided. The wafer temperature is maintained between 50° to 100° C.

Figure 2E:
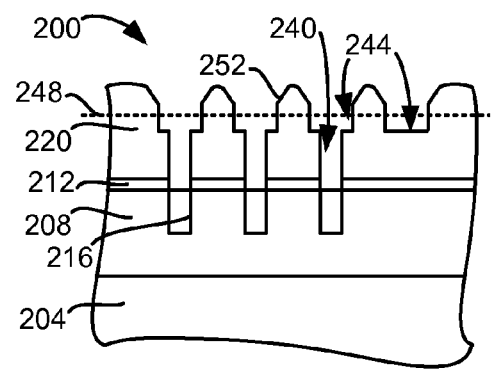

The tops of the trenches are rounded (step 120). FIG. 2E shows the stack after the tops 252 of the trenches 244 have been rounded. The rounding occurs above a planarization target line or plane 248. Preferably, no rounding occurs below the planarization target line 248. Because the tops are rounded above the planarization target line or plane 248, the sidewalls of the tops 252 of the trenches 244 above the planarization target line 248 is shallower than the sidewalls below the planarization target line 248. In this embodiment, the tops 252 of the trenches are rounded simultaneously during the opening of the etch stop layer 212. More preferably, the rounding and etch stop opening is a two step process. In an example of such a recipe, a rounding gas comprising $CF_4$, $C_4F_8$, $N_2$, and Ar is provided. The rounding gas is formed into a plasma. A chuck temperature is maintained between 50° C. and 100° C.

Figure 2F:
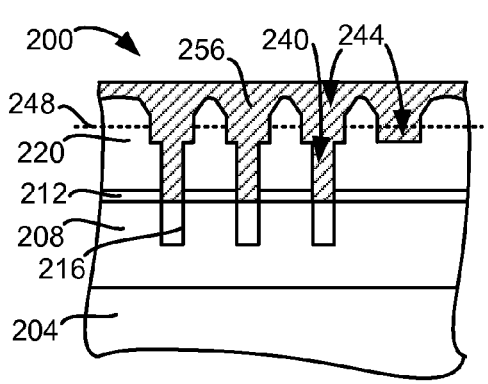

The vias and trenches are filled (step 124). In this embodiment, the trenches and vias are filled with a copper containing conductor. FIG. 2F shows the stack 200 after the vias 240 and trenches 244 are filled with a copper containing conductor 256. One example recipe for filling the trenches and vias is providing a copper electroplating. In this example, a barrier layer is first formed on the walls of the vias and trenches. A seed layer is then formed on the barrier layer. A voltage is applied to the seed layer and the vias and trenches are placed in a copper containing acid bath. A copper containing metal is deposited in the trenches and vias on the seed layer. In other embodiments, an electroless copper deposition may be used.

The stack 200 is planarized (step 128). In this embodiment, a chemical mechanical polishing (CMP) is used to planarize the stack 200 to the planarization target line or plane 248. FIG. 2G shows the stack after the stack is planarized to the planarization target line or plane 248. FIG. 3 is a cross-sectional view of the stack 200 along cut line 3-3 of FIG. 2G. The view in FIG. 3 more clearly shows the linear cross-section of the trench 244 and the cross-sections of vias 240.

The resulting structure provides trenches and vias with substantially vertical sidewalls. The conductive metal 256 filling the trenches 244 and vias 240 form conductive contacts and interconnects. For 28 nm gate CD, it has been found that rounding the tops of the trenches removes corners and provides a wider opening allowing for improved deposition for filling the vias and trenches. The removal of corners also reduces overhangs, which improves deposition. It was also found that wider openings increase leakage between contacts. By widening only the tops of trenches above the planarization target and then removing the stack above the planarization target, the filing of conductive material is improved without increasing leakage. In addition, using a combination of a less selective etch to partially etch the vias and then using a highly selective etch to etch the trenches and over etch the vias, allows a faster etching process that provides vertical sidewalls. This embodiment of the invention avoids bowing. Embodiments of the invention provide a greater robustness and additional controls, which may used to adjust parameters to reduce striation or bowing or provide other benefits.

Additional processes may be used to complete the formation of semiconductor devices.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for forming conductive contacts in a dielectric layer, comprising:
   etching partial vias into the dielectric layer through a via mask;
   etching trenches into the dielectric layer through a trench mask, wherein the etching the trenches completes and over etches the vias to widen bottoms of the vias; and
   rounding tops of the trenches or vias.

2. The method, as recited in claim 1, wherein the rounding the tops of the trenches or vias opens an etch stop layer at bottoms of the vias and rounds part of the dielectric layer forming tops of trenches or vias.

3. The method, as recited in claim 2, further comprising:
   filling the vias and trenches with a copper containing conductive material; and
   planarizing the vias, trenches, and dielectric layer to a planarization target.

4. The method, as recited in claim 3, wherein the rounding tops of the trenches or vias does not round parts of the trenches and vias below the planarization target.

5. The method, as recited in claim 4, wherein the rounding the tops of the trenches or vias provides an electrostatic chuck temperature between 50° to 100° C. and wherein the etching trenches is more selective than etching partial vias.

6. The method, as recited in claim 5, wherein the rounding the tops of the trenches or vias further comprises providing a gas comprising $CF_4$, $C_4F_8$, and $N_2$.

7. The method, as recited in claim 6, wherein the gas further comprises Ar.

8. The method, as recited in claim 7, wherein a trench patterned hardmask is over the dielectric layer, and wherein a planarization layer is over the trench patterned hardmask and dielectric layer, and wherein a via patterned mask is over the planarization layer.

9. The method, as recited in claim 8, wherein the rounding the tops of the trenches or vias cause the sidewalls at the tops of the trenches or vias to have a different slope than sidewalls at the planarization target.

10. The method, as recited in claim 9, further comprising exposing the trench mask after etching partial vias and before etching trenches.

11. The method, as recited in claim 1, further comprising:
    filling the vias and trenches with a copper containing conductive material; and
    planarizing the vias, trenches, and dielectric layer to a planarization target.

12. The method, as recited in claim 1, wherein the rounding tops of the trenches or vias does not round parts of the vias below the planarization target.

13. The method, as recited in claim 1, wherein the rounding the tops of the trenches or vias provides an electrostatic chuck temperature between 50° to 100° C.

14. The method, as recited in claim 13, wherein the rounding the tops of the trenches or vias further comprises providing a gas comprising $CF_4$, $C_4F_8$, and $N_2$.

15. The method, as recited in claim 14, wherein the gas further comprises Ar.

16. The method, as recited in claim 1, wherein a trench patterned hardmask is over the dielectric layer, and wherein a planarization layer is over the trench patterned hardmask and dielectric layer, and wherein a via patterned mask is over the planarization layer.

17. The method, as recited in claim 16, further comprising exposing the trench mask after etching partial vias and before etching trenches.

18. The method, as recited in claim 1, wherein the rounding the tops of the trenches or vias cause the sidewalls at the tops of the trenches or vias to have a different slope than sidewalls at the planarization target.

19. A method for forming conductive contacts in a dielectric layer disposed below a trench mask disposed below a via mask forming a stack, comprising:
- etching partial vias into the dielectric layer through the via mask;
- exposing the trench mask;
- etching trenches into the dielectric layer through the trench mask, wherein the etching the trenches completes and over etches the vias to widen bottoms of the vias;
- rounding tops of the trenches or vias above a planarization line;
- filling the vias and trenches with a conductive material; and
- planarizing the stack to the planarization line.

* * * * *